United States Patent [19]

Yamada et al.

[11] Patent Number: 4,533,903
[45] Date of Patent: Aug. 6, 1985

[54] ANALOG-TO-DIGITAL CONVERTER

[75] Inventors: Takaaki Yamada, Zama; Takeo Sekino, Atsugi, both of Japan

[73] Assignee: Sony Corporation, Tokyo, Japan

[21] Appl. No.: 396,499

[22] Filed: Jul. 8, 1982

[30] Foreign Application Priority Data

Jul. 10, 1981 [JP] Japan .................................. 56-107656

[51] Int. Cl.³ .......................................... H03K 13/175
[52] U.S. Cl. ................................ 340/347 AD; 307/361
[58] Field of Search .................. 340/347 AD, 347 CC, 340/347 M; 307/361

[56] References Cited

U.S. PATENT DOCUMENTS 3,585,631  6/1971  McCown ...................... 340/347 AD
4,417,233  11/1983 Inoue ............................. 340/347 AD Primary Examiner—Charles D. Miller
Attorney, Agent, or Firm—Lewis H. Eslinger; Alvin Sinderbrand

[57] ABSTRACT

An analog-to-digital converter for converting an analog input voltage signal to a digital output voltage signal of m upper bits and n lower bits includes at least $(2^{m+n}-1)$ resistors connected in a series circuit to a voltage source for establishing respective reference voltages; at least $(2^m-1)$ upper bit voltage comparators for generating outputs indictive of the m upper bits, and having first and second inputs, the analog input voltage being applied to the first inputs and the second inputs being connected to the series circuit at respective intervals defining groups of the resistors; an upper bit encoder receiving the outputs of the upper bit voltage comparators and generating a switch control signal and a digital output voltage signal of m upper bits; at least $(2^n-1)$ lower bit voltage comparators for generating outputs indicative of the n lower bits, and having first and second inputs, the analog input voltage signal being applied also to the first inputs of the lower bit voltage comparators; switch elements associated with each of the groups and being responsive to the switch control signal for selectively connecting the second inputs of the lower bit comparators to respective resistors in the associated resistor groups; and a lower bit encoder receiving the outputs of the lower bit voltage comparators and generating a digital output voltage signal of n lower bits.

15 Claims, 7 Drawing Figures

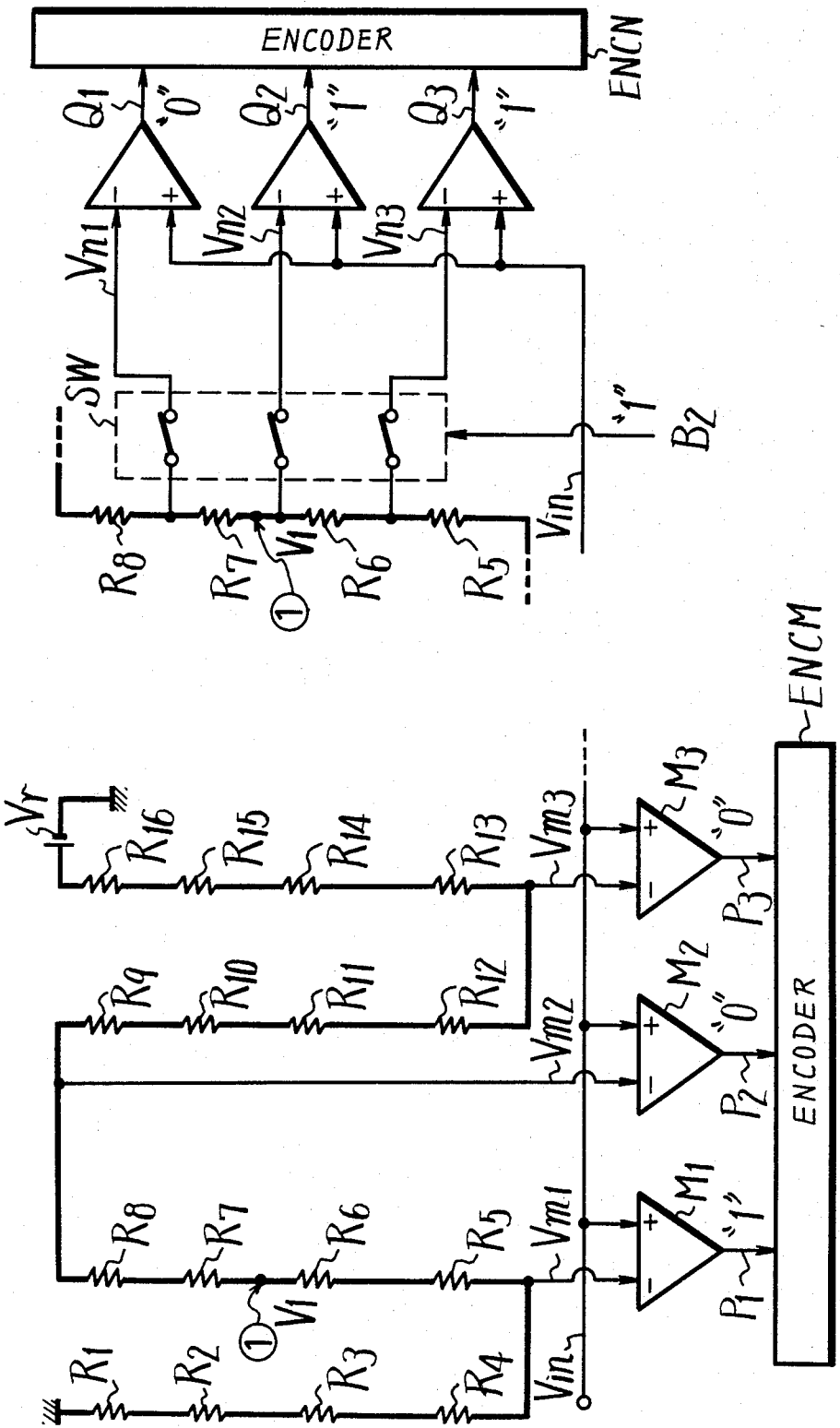

FIG. 4

| P$_1$ | P$_2$ | P$_3$ | B$_1$ | B$_2$ | B$_3$ | B$_4$ | S$_0$ | D$_3$ | D$_2$ |
|---|---|---|---|---|---|---|---|---|---|
| 0 | 0 | 0 | 1 | 0 | 0 | 0 | 0 | 0 | 0 |
| 1 | 0 | 0 | 0 | 1 | 0 | 0 | 1 | 0 | 1 |
| 1 | 1 | 0 | 0 | 0 | 1 | 0 | 0 | 1 | 0 |
| 1 | 1 | 1 | 0 | 0 | 0 | 1 | 1 | 1 | 1 |

① → row 2
② → row 3

FIG. 5

| S$_0$ | Q$_1$ | Q$_2$ | Q$_3$ | D$_1$ | D$_0$ |
|---|---|---|---|---|---|
| 0 | 0 | 0 | 0 | 0 | 0 |
| 0 | 1 | 0 | 0 | 0 | 1 |
| 0 | 1 | 1 | 0 | 1 | 0 |
| 0 | 1 | 1 | 1 | 1 | 1 |
| 1 | 0 | 0 | 0 | 0 | 0 |
| 1 | 0 | 0 | 1 | 0 | 1 |
| 1 | 0 | 1 | 1 | 1 | 0 |
| 1 | 1 | 1 | 1 | 1 | 1 |

② → row 2
① → row 7

4,533,903

ANALOG-TO-DIGITAL CONVERTER

BACKGROUND OF THE INVENTION

1. Field of the Invention

This invention relates to analog-to-digital converters, and more particularly, to an analog-to-digital converter having a minimal number of voltage comparing circuits.

2. Description of the Prior Art

Prior art analog-to-digital converters can generally be classified as either parallel-type converters or serial-to-parallel type converters.

Parallel-type analog-to-digital converters which produce n bit digital outputs generally require $(2^n-1)$ comparing circuits or comparators connected in parallel. An analog input voltage is supplied to the $(2^n-1)$ voltage comparators, and the outputs from the comparators are supplied to an encoder which then produces the n digit output.

In a serial-to-parallel type analog-to-digital converter having an output of m upper bits and n lower bits, the input voltage is supplied to a first stage of $(2^m-1)$ voltage comparing circuits or comparators, just as in the parallel-type analog-to-digital converter, to generate the m upper bits. The m upper bits are then supplied to a digital-to-analog converter and reconverted to an analog voltage. The reconverted analog voltage is then subtracted from the analog input voltage and the difference is supplied to a second stage of $(2^n-1)$ voltage comparators to derive the n lower bits.

In the parallel-type analog-to-digital converter, $(2^n-1)$ voltage comparators are required when the analog input voltage is converted to a digital output of n bits. A large number of circuit elements are required for such an analog-to-digital converter, and the resulting integrated circuit is large and has a correspondingly large power consumption.

In the serial-to-parallel analog-to-digital converter, only $(2^m+2^n-2)$ voltage comparators are used when the output has m+n bits. The chip size and power consumption are reduced as compared to the parallel-type analog-to-digital converter. However, a serial-to-parallel analog-to-digital converter requires a digital-to-analog converter. If an error occurs between the first and second stages of the converter, the error is repeated in the digital output. For example, with a monotonically increasing voltage $V_{in}$, if an error occurs between the first and second stages so that the output from the first stage is reduced, the digital output from the second stage will be reduced, and the digital output of the converter will not increase monotonically.

OBJECTS AND SUMMARY OF THE INVENTION

Accordingly, it is an object of the present invention to provide an analog-to-digital converter which can overcome the aforementioned problems of prior art analog-to-digital converters.

It is another object of the present invention to provide an analog-to-digital converter which uses fewer voltage comparing circuits than the prior art devices.

It is still another object of the present invention to provide an analog-to-digital converter that can be formed in a compact, integrated circuit.

It is still a further object of the present invention to provide an analog-to-digital converter with a reduced power consumption as compared to the prior art devices.

In accordance with one aspect of the present invention, an analog-to-digital converter for converting an analog input voltage signal to a digital output voltage signal of m upper bits and n lower bits includes at least $(2^{m+n}-1)$ resistors connected in a series circuit to a voltage source for establishing respective reference voltages. Upper bit comparators with first and second inputs generate outputs indicative of the m upper bits, with the analog input voltage signal being connected to the first inputs and the series circuit of resistors being connected to the second inputs at respective intervals defining groups of the resistors. An upper bit encoder receives the outputs of the upper bit comparators and generates a switch control signal and a digital output voltage signal of m upper bits. Lower bit comparators with first and second inputs generate outputs indicative of the n lower bits, with the analog input voltage being connected to the first inputs. Switch elements are associated with each of the groups and are responsive to the switch control signal for selectively connecting the second inputs of the lower bit comparators to respective resistors in the associated resistor groups. A lower bit encoder receives the outputs of the lower bit comparators and generates a digital output voltage signal of n lower bits.

The above, and other objects, features and advantages of the invention will be apparent from the following detailed description of an illustrative embodiment thereof which is to be read in connection with the accompanying drawings.

BRIEF DESCRIPTION OF THE DRAWINGS

FIGS. 3B and 3C are partial block diagrams illustrating the operation of the analog-to-digital converter of FIG. 3A; and FIGS. 4 and 5 are truth tables of encoders illustrated in the embodiment of FIG. 3A.

DESCRIPTION OF THE PREFERRED EMBODIMENT

Figure 1:
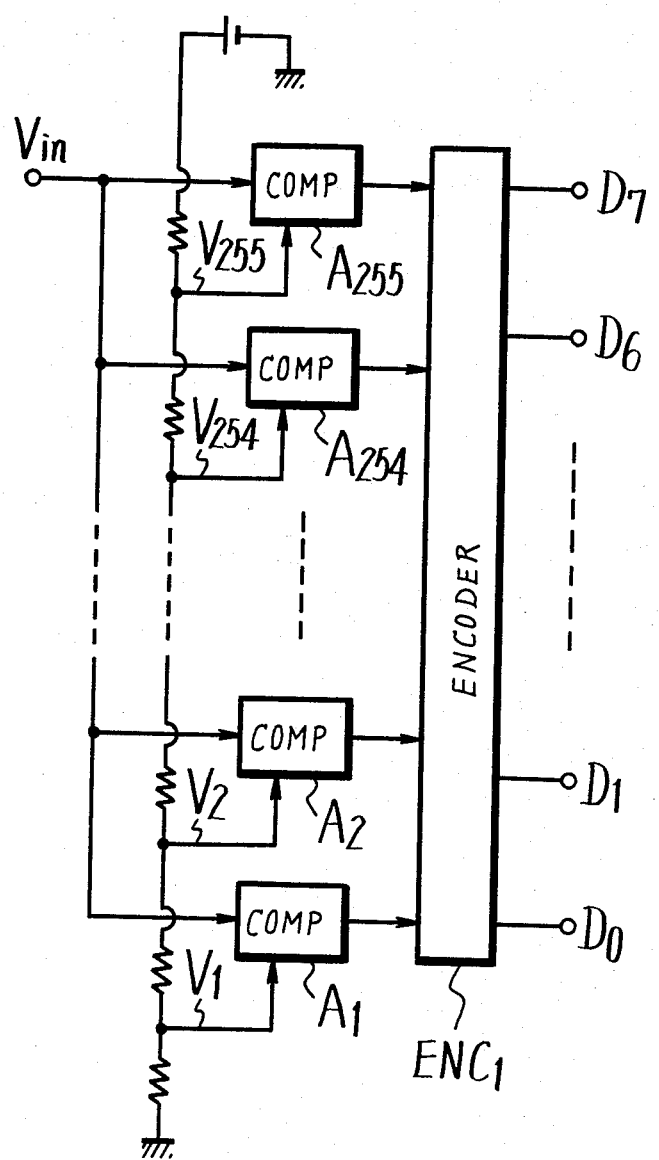
FIG. 1 is a block diagram illustrating a prior art parallel-type analog-to-digital converter.

Referring initially to FIG. 1, a parallel-type analog-to-digital converter known in the prior art is disclosed in which an analog input voltage $V_{in}$ is converted to an $n=8$ bit digital output $D_0$ to $D_7$. The parallel-type analog-to-digital converter of FIG. 1 has 255, that is, $(2^8-1)$, voltage comparing circuits or comparators $A_1$ to $A_{255}$, providing 255 reference voltage steps $V_1$ to $V_{255}$. Analog input voltage $V_{in}$ is compared with each of reference voltages $V_1$ to $V_{255}$, and outputs from comparator circuits $A_1$ to $A_{255}$ are supplied to an encoder $ENC_1$ which generates digital outputs $D_0$ to $D_7$.

Figure 2:
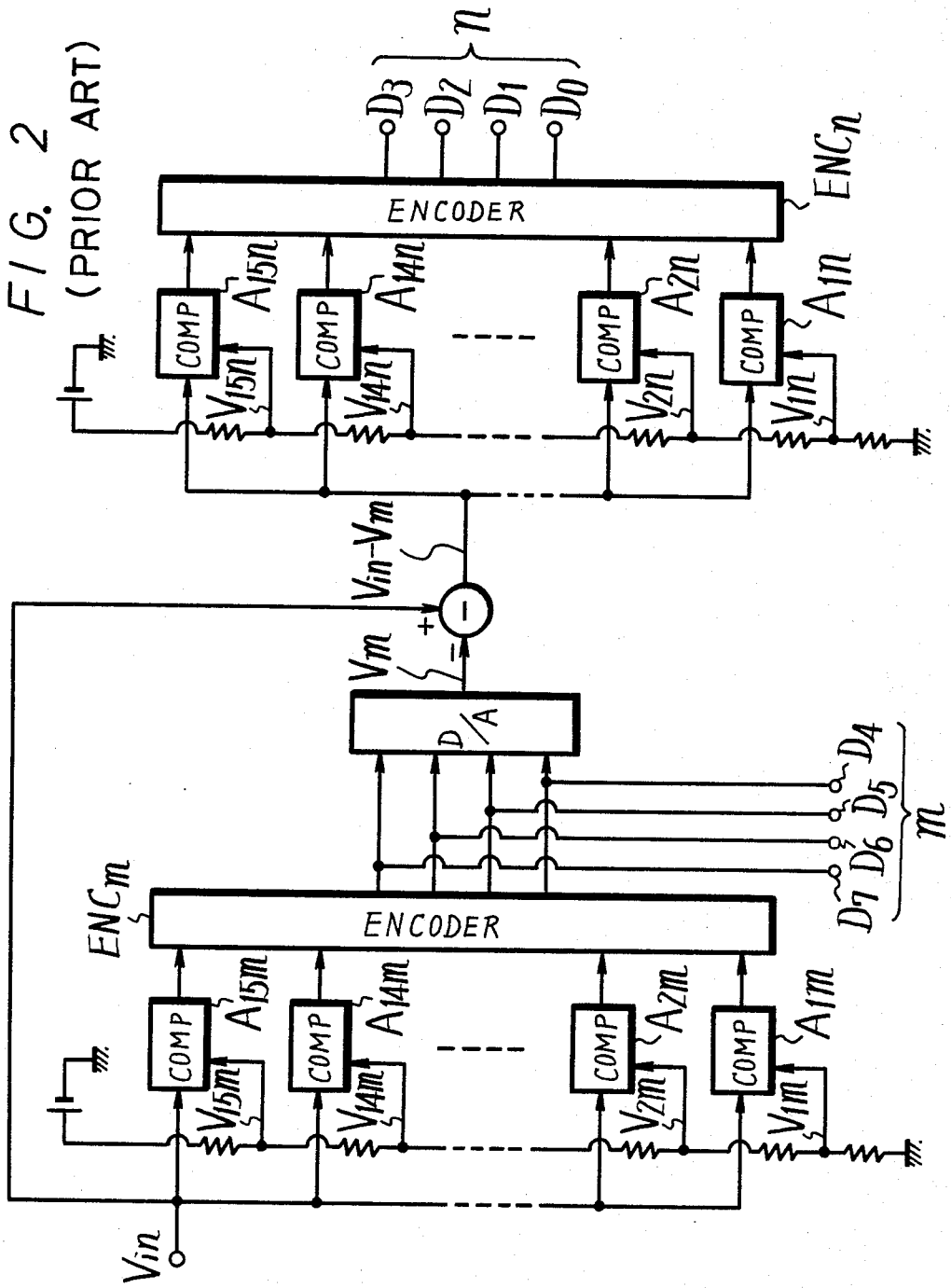
FIG. 2 is a block diagram showing a prior art serial-to-parallel analog-to-digital converter.

In FIG. 2, a serial-to-parallel type analog-to-digital converter is shown in which analog input voltage $V_{in}$ is converted to a digital output voltage of $n=4$ lower bits and $m=4$ upper bits. In the illustrative embodiment, the n lower bits are denoted as $D_0$ to $D_3$, while the m upper bits are denoted as $D_4$ to $D_7$. Input voltage $V_{in}$ is supplied to a first or front stage of the serial-to-parallel type analog-to-digital converter having 15, that is, $(2^4-1)$, comparison circuits or comparators $A_{1m}$ to $A_{15m}$ and corresponding voltage steps $V_{1m}$ to $V_{15m}$, from which digital outputs are supplied to a first encoder $ENC_m$, from which digital outputs $D_4$ to $D_7$ are derived. Digital outputs $D_4$ to $D_7$ are supplied to a digital-to-analog converter where they are reconverted to an analog voltage $V_m$. Analog voltage $V_m$ is then subtracted from input voltage $V_{in}$, and the difference is supplied to a second or rear stage of the serial-to-parallel type analog-to-digital converter. The second stage has 15, that is, $(2^4-1)$ comparison circuits $A_{1n}$ to $A_{15n}$ and corresponding voltage steps $V_{1n}$ to $V_{15n}$, and supplies outputs to a second encoder $ENC_n$, which generates n lower bits $D_0$ to $D_3$.

Figure 3A:
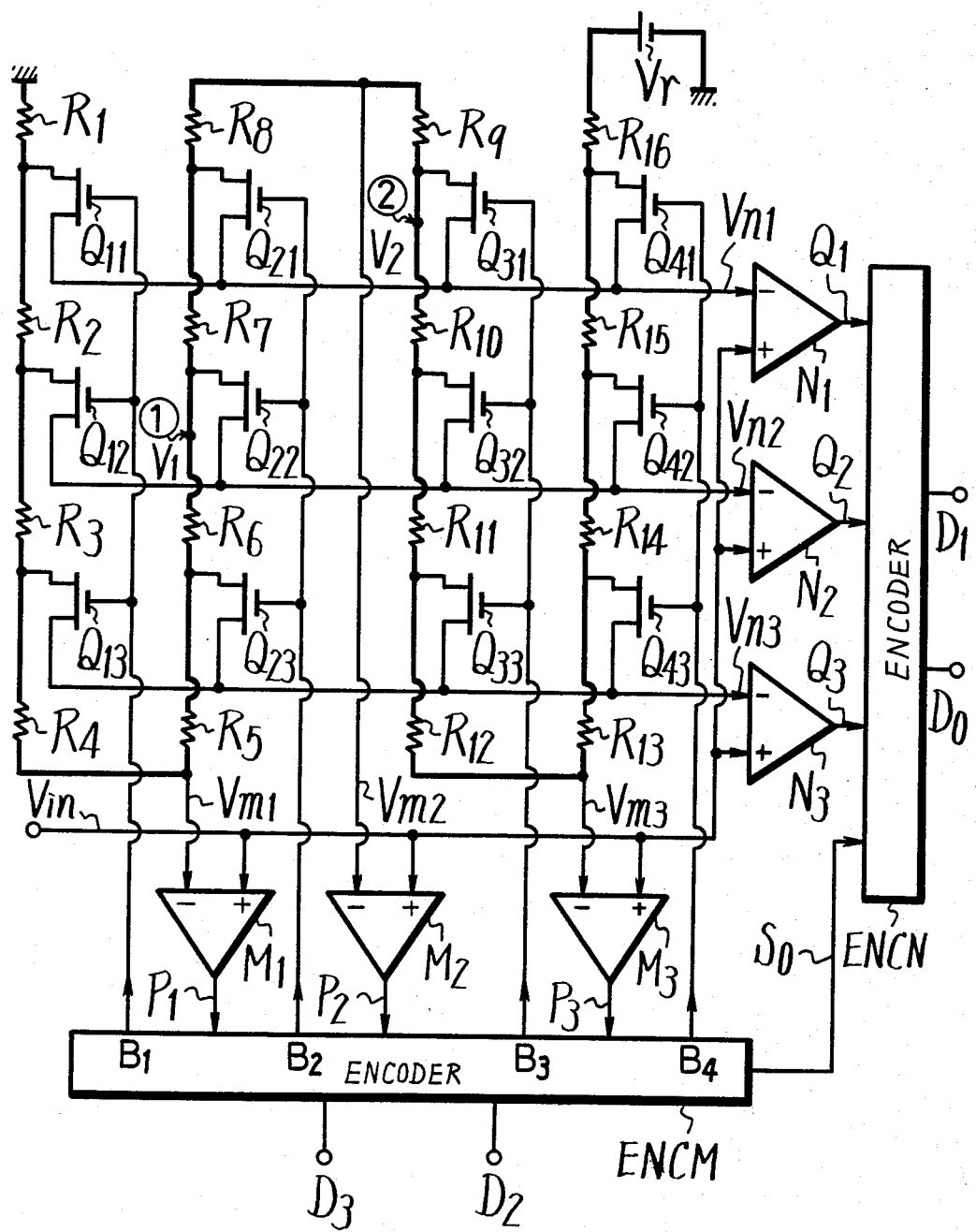
FIG. 3A is a block diagram illustrating an analog-to-digital converter according to one embodiment of the present invention.

Referring now to FIG. 3A, it will be seen that, in the analog-to-digital converter according to the embodiment of the invention there illustrated, an analog input voltage $V_{in}$ is supplied to first or positive inputs of three voltage comparators $M_1$ to $M_3$ for determining an upper bit digital voltage and three voltage comparators $N_1$ to $N_3$ for determining a lower bit digital voltage. Resistors $R_1$ to $R_{16}$ are connected in series between a reference voltage supply source $V_r$ and ground. The resistors $R_1$ to $R_4$, $R_5$ to $R_8$, $R_9$ to $R_{12}$, and $R_{13}$ to $R_{16}$ are arranged in groups of four resistors, with each group providing four reference voltage steps. Comparator $M_1$ has its second or negative input connected between resistors $R_4$ and $R_5$ and is supplied with voltage $V_{m1}$. Comparator $M_2$ has its second or negative input connected between resistors $R_8$ and $R_9$ and is supplied with voltage $V_{m2}$. Comparator $M_3$ has its second or negative input connected between resistors $R_{12}$ and $R_{13}$ and is supplied with voltage $V_{m3}$.

Switch elements, preferably in the form of metal oxide semiconductor field effect transistors (MOS-FETs) $Q_{11}$, $Q_{21}$, $Q_{31}$ and $Q_{41}$ have their sources connected to the series resistor circuit between resistors $R_1$ and $R_2$, $R_7$ and $R_8$, $R_9$ and $R_{10}$, and $R_{15}$ and $R_{16}$, respectively, and their drains connected to a second or negative input terminal of comparator $N_1$. Switch elements constituted by MOS-FETs $Q_{12}$, $Q_{22}$, $Q_{32}$ and $Q_{42}$ are similarly connected between resistors $R_2$ and $R_3$, $R_6$ and $R_7$, $R_{10}$ and $R_{11}$, and $R_{14}$ and $R_{15}$ and a second or negative input terminal of comparator $N_2$. Switch elements constituted by MOS-FETs $Q_{13}$, $Q_{23}$, $Q_{33}$ and $Q_{43}$ are similarly connected between resistors $R_3$ and $R_4$, $R_5$ and $R_6$, $R_{11}$ and $R_{12}$, and $R_{13}$ and $R_{14}$ and a second or negative input terminal of comparator $N_3$.

Comparators $M_1$, $M_2$ and $M_3$ generate output signals $P_1$, $P_2$ and $P_3$ indicative of the upper bits of the digital output voltage. Outputs $P_1$, $P_2$ and $P_3$ are supplied to an encoder ENCM from which upper bits $D_2$ and $D_3$ of the digital output are derived. Upper bit encoder ENCM also selectively generates control signals $B_1$ to $B_4$ which are supplied to the gates of respective MOS-FETs $Q_{11}$ to $Q_{13}$, $Q_{21}$ to $Q_{23}$, $Q_{31}$ to $Q_{33}$, and $Q_{41}$ to $Q_{43}$, respectively. In addition, upper bit encoder ENCM generates a second control signal $S_0$, whose function will be described below.

Control signals $B_1$ to $B_4$ from encoder ENCM selectively actuate MOS-FET's $Q_{11}$ to $Q_{13}$, $Q_{21}$ to $Q_{23}$, $Q_{31}$ to $Q_{33}$, and $Q_{41}$ to $Q_{43}$, respectively, to supply voltages $V_{n1}$, $V_{n2}$, and $V_{n3}$ to the negative input terminals of comparators $N_1$, $N_2$, and $N_3$, as shown in FIGS. 3A and 3C, which generate outputs $Q_1$, $Q_2$, $Q_3$ supplied to the lower bit encoder ENCN. Encoder ENCN generates lower bits $D_0$ and $D_1$ from outputs $Q_1$, $Q_2$, and $Q_3$ and control signal $S_0$ supplied from upper bit encoder ENCM.

FIG. 4 illustrates the truth table for the encoder ENCM, while FIG. 5 illustrates the truth table for the encoder ENCN. The table of FIG. 4 indicates the outputs $B_1$ to $B_4$, $S_0$, $D_3$ and $D_2$ for given input signals $P_1$ to $P_3$. The table of FIG. 5 indicates the outputs $D_1$ and $D_0$ for given input signals $S_0$, $Q_1$, $Q_2$ and $Q_3$.

The operation of the illustrated embodiment of the invention will now be described with reference to FIGS. 3A, 3B, and 3C. If analog input voltage $V_{in}$ is equal to a reference electric potential $V_1$ at a connection point between resistors $R_6$ and $R_7$, as denoted by reference point ① in FIG. 3A, then analog input voltage $V_{in}$ is greater than $V_{m1}$, but less than $V_{m2}$ and $V_{m3}$. Output $P_1$, representing a comparison between $V_{in}$ and $V_{m1}$, is equal to "1". Output $P_2$, representing a comparison between $V_{in}$ and $V_{m2}$, is equal to "0", since $V_{in}$ is less than $V_{m2}$. Output $P_3$ is equal to "0", as $V_{in}$ is less than $V_{m3}$. Reading across the second row of the truth table of FIG. 4, bit $D_3$ is equal to "0" and bit $D_2$ is equal to "1".

FIG. 3B illustrates the circuit of FIG. 3A from which the MOS-FETs $Q_{11}$ to $Q_{43}$, comparators $N_1$ to $N_3$, and encoder ENCN have been eliminated for clarity. Outputs $P_1$, $P_2$ and $P_3$ are also indicated as "1", "0", and "0", respectively.

Referring to the second row of the truth table of FIG. 4, control signal $B_1$ is equal to "0", control signal $B_2$ is equal to "1", control signal $B_3$ is equal to "0", and control signal $B_4$ is equal to "0". Accordingly, MOS-FETs $Q_{21}$, $Q_{22}$ and $Q_{23}$, indicated in FIG. 3C as switch assembly SW, are turned on to allow the electric potentials at the respective connection points between the adjacent resistors $R_8$ and $R_7$, $R_7$ and $R_6$, and $R_6$ and $R_5$, respectively, to be supplied to the comparators $N_1$, $N_2$ and $N_3$ as voltages $V_{n1}$, $V_{n2}$, and $V_{n3}$. Since input voltage $V_{in}$ is equal to the electric potential $V_1$ at point ①, analog input voltage $V_{in}$ is less than reference voltage $V_{n1}$, is equal to reference voltage $V_{n2}$, and is greater than reference voltage $V_{n3}$. Accordingly, $Q_1$ is equal to "0", $Q_2$ is equal to "1", and $Q_3$ is equal to "1". Reading across the seventh row of the truth table of FIG. 5, with $S_0$ equal to "1", bit $D_1$ is equal to "1" and bit $D_0$ is equal to "0".

When analog input voltage $V_{in}$ is equal to electric potential $V_1$ at point ①, digital outputs $D_3$ to $D_0$ become "0 1 1 0". The electric potential at the point ① is the electric potential of the sixth step, counting from the ground side, where the ground electric potential is numbered as step zero. The decimal number six is binary number "0 1 1 0", so the digital output "0110" is correct.

By way of a second example, if analog input voltage $V_{in}$ is equal to an electric potential $V_2$ at the connection point between resistors $R_9$ and $R_{10}$, as shown, for example, at point ② in FIG. 3A, electric potential $V_2$ at point ② is greater than $V_{m1}$ and $V_{m2}$, but less than $V_{m3}$. Accordingly, output $P_1$ is equal to "1", output $P_2$ is equal to "1", and output $P_3$ is equal to "0". Reading across the third row of the truth table of FIG. 4, bit $D_3$ is equal to "1" and bit $D_2$ is equal to "0".

The truth table of FIG. 4 also indicates that control signal $B_1$ is equal to "0", control signal $B_2$ is equal to "0", control signal $B_3$ is equal to "1", and control signal $B_4$ is equal to "0". Accordingly, only MOS-FETs $Q_{31}$, $Q_{32}$ and $Q_{33}$ are turned on to supply electric potentials at the respective connection points between adjacent resistors $R_9$ to $R_{12}$ to comparators $N_1$, $N_2$, $N_3$. Since input voltage $V_{in}$ is the same as electric potential $V_2$ at point ②, analog input voltage $V_{in}$ is equal to reference voltage $V_{n1}$, but is less than reference voltages $V_{n2}$ and $V_{n3}$. $Q_1$ is equal to "1", $Q_2$ is equal to "0", and $Q_3$ is equal to "0". From the truth table of FIG. 4, $S_0$ is equal to "0". The truth table of FIG. 5 indicates in the second row that bit $D_1$ is equal to "0", and bit $D_0$ is equal to "1".

When analog input voltage $V_{in}$ is equal to electric potential $V_2$, digital outputs $D_3$ to $D_0$ become "1 0 0 1". Electric potential $V_2$ at point ② is the electric potential of the ninth step, counting from the ground side. The decimal number nine is binary number "1001", indicating that the digital output "1001" is correct.

In the illustrated embodiment of the invention, the voltage derived from each of the four groups of resistors into which resistors $R_1$ to $R_{16}$ are divided is compared with analog input voltage $V_{in}$ to derive upper bits $D_3$ and $D_2$ of the digital output and to select one of such resistor groups. The voltage derived from each resistor of the selected group is compared with analog input voltage $V_{in}$ to derive lower bits $D_1$ and $D_0$ of the digital output. If there are m upper bits and n lower bits of digital output required, the illustrated embodiment of the invention utilizes $2^m - 1$ upper bit voltage comparators and $2^n - 1$ lower bit voltage comparators. An analog-to-digital converter according to the present invention thus has far fewer comparators or comparison circuits than the prior art analog-to-digital converter of FIG. 1 which, for m+n bits of output, would require $(2^{m+n} - 1)$ comparators. An analog-to-digital converter in accordance with the present invention can also be produced on a smaller chip which uses lesser amounts of power than the prior art devices.

An analog-to-digital converter in accordance with the present invention eliminates a digital-to-analog converter, as required by the serial-to-parallel analog-to-digital converter of FIG. 2, and any errors which may result therefrom.

When the analog-to-digital converter of the present invention is an integrated circuit, resistors $R_1$ to $R_{16}$ can be formed in a zigzag line on the chip. Resistors $R_1$ to $R_{16}$ occupy only small areas on the chip, so temperature variations have minimal effects upon the circuit elements, thereby contributing to a precision circuit.

Further, when the circuit elements are formed as shown in FIG. 3A, the semiconductor chip is compact. In a preferred embodiment of the present invention, a very compact circuit is produced when the bit ratio of the upper and lower bits is 1, as for example, a bit ratio of 4:4.

When an analog-to-digital converter is formed with resistors $R_1$ to $R_{16}$ in a zigzag pattern, the reference voltage increases from top to bottom, as shown in FIG. 3A, in resistor strings $R_1$ to $R_4$ and $R_9$ to $R_{12}$ (hereinafter referred to as group A), and decreases from top to bottom in resistor strings $R_5$ to $R_8$ and $R_{13}$ to $R_{16}$ (hereinafter referred to as group B). Since the reference bias conditions of the resistor strings of group A differ from those of the resistor strings of group B, voltage comparators $N_1$, $N_2$ and $N_3$ should be accordingly interchanged when the different groups are connected by the respective switch assemblies SW. In the illustrated embodiment, outputs $Q_1$, $Q_2$ and $Q_3$ of comparators $N_1$, $N_2$ and $N_3$ are inverted in response to control signal $S_0$ from upper bit encoder ENCM, rather than physically interchanging comparators $N_1$, $N_2$ and $N_3$. For example, if outputs $Q_1$, $Q_2$ and $Q_3$ equal "1", "0" and "0", they are inverted to be equal to "0", "1" and "1" respectively.

In the above second example in which analog input voltage $V_{in}$ is equal to an electric potential $V_2$ at the connection point between resistors $R_9$ and $R_{10}$, as shown at point ② in FIG. 3A, as described above, upper bit encoder ENCM will generate control signal $B_3$ equal to "1" to couple resistor string $R_9$ to $R_{12}$ to comparators $N_1$, $N_2$ and $N_3$. Outputs $Q_1$, $Q_2$ and $Q_3$ of comparators $N_1$, $N_2$ and $N_3$ will be equal to "1", "0", and "0", respectively.

However, in the second example, the distance on the integrated circuit chip from resistor $R_9$ to point ② is the same as the distance from the resistor $R_8$ to point ① of the first example, and the voltage differences are the same. Accordingly, outputs $Q_1$, $Q_2$ and $Q_3$, which are equal to "1", "0", and "0", must be inverted to be equal to "0", "1", and "1". Upper bit encoder ENCM generates control signal $S_0$ to effect the required inversion.

Since the reference voltages derived from resistors $R_1$ to $R_{16}$ are used to generate digital outputs $D_3$ to $D_0$, a monotonic change in input voltage $V_{in}$ has a corresponding monotonic change in digital outputs $D_3$ to $D_0$.

In the embodiment of FIG. 3, the resistor $R_{16}$ can be eliminated, and the invention will function as hereinbefore described.

The analog-to-digital converter of the present invention is not limited to the 4 bit analog-to-digital converter of the illustrative embodiment, but can also be applied equally to an 8 or 16 bit analog-to-digital converter.

Although a specific embodiment of the invention has been described in detail herein with reference to the accompanying drawings, it is to understood that the invention is not limited to that precise embodiment, and that various changes and modifications may be effected therein by one skilled in the art without departing from the scope and spirit of the invention as defined in the appended claims.

What is claimed is:

1. An analog-to-digital converter for converting an analog input voltage signal to a digital output voltage signal of m upper bits and n lower bits comprising:

a plurality of resistor means connected in a series circuit to a voltage source for establishing respective reference voltages;

upper bit comparators for generating outputs indicative of said m upper bits and having first inputs each receiving said analog input voltage and second inputs each connected to said series circuit at respective intervals defining groups of said resistor means therebetween, each of said groups including a plurality of resistor means;

upper bit encoder means receiving said outputs from said upper bit comparators for generating said m upper bits of said output signal and a switch control signal;

lower bit comparators for generating outputs indicative of said n lower bits and having first inputs each receiving said analog input voltage and second inputs;

switch means associated with each of said groups of said resistor means and being responsive to said switch control signal for selectively connecting each of said second inputs of said lower bit comparators to a respective resistor means in said associated group of resistor means; and lower bit encoder means receiving said outputs from said lower bit comparators for generating said n lower bits of said digital output signal.

2. The analog-to-digital converter of claim 1; in which said resistor means are arranged in a plurality of rows, with each of said groups constituting one of said rows.

3. The analog-to-digital converter of claim 2; in which said rows of said resistor means are parallel.

4. The analog-to-digital converter of claim 2; in which said rows of said resistor means are arranged in a zigzag pattern.

5. The analog-to-digital converter of claim 1; in which said resistor means are arranged in a zigzag pattern, and said upper bit encoder means generates an inverting control signal; and further comprising means for supplying said inverting control signal to said lower bit encoder means.

6. The analog-to-digital converter of claim 1; in which there are at least $2^{m+n}-1$ resistor means connected in series.

7. The analog-to-digital converter of claim 6; in which there are at least $2^m-1$ upper bit comparators.

8. The analog-to-digital converter of claim 7; in which there are at least $2^n-1$ lower bit comparators.

9. The analog-to-digital converter of claim 8; in which there are at least $2^{m+n}-1$ switch means.

10. The analog-to-digital converter of claim 9; in which each of said groups of resistor means is $2^n$ resistor means connected in series.

11. The analog-to-digital converter of claim 10; in which said resistor means are arranged in parallel rows, with each of said groups constituting one of said rows.

12. The analog-to-digital converter of claim 9; in which the number of said upper bit comparators equals the number of said lower bit comparators.

13. The analog to digital converter of claim 1; in which said switch means are metal oxide semiconductor field effect transistors.

14. The analog-to-digital converter of claim 13; in which said resistor means are formed on a semiconductor chip.

15. The analog-to-digital converter of claim 14; in which said resistor means are formed in a zigzag pattern on said semiconductor chip.

* * * * *